Oct. 18, 1966 R. EMEIS 3,280,383

ELECTRONIC SEMICONDUCTOR DEVICE

Filed March 27, 1962 4 Sheets-Sheet 1

3,280,383

ELECTRONIC SEMICONDUCTOR DEVICE

Reimer Emeis, Ebermannstadt, Germany, assignor to Siemens-Schuckertwerke Aktiengesellschaft, Berlin-Siemensstadt, Germany, a corporation of Germany Filed Mar. 27, 1962, Ser. No. 182,748
Claims priority, application Germany, Mar. 28, 1961, S 73,181; June 24, 1961, S 74,486; July 7, 1961, S 74,696
16 Claims. (Cl. 317—234)

My invention relates to junction-type rectifiers, transistors, and other electronic semiconductor devices.

Known devices of this kind generally comprise a disc-shaped semiconductor body in large-area connection with a carrier plate of a material having good electric and thermal conductance, and also a thermal coefficient of expansion not appreciably different from that of the semiconductor material. When the semiconductor disc is of germanium or silicon, the carrier plate may, for example, consist of molybdenum or tungsten.

When such a carrier plate is connected with a metal body serving to cool the device during operation, for example with a copper block provided with cooling vanes, or forming part of a cooling-water circulation system or the like, various difficulties are encountered. The connection of the carrier plate with the heat-sink body must likewise extend over a relatively large area in order to secure a good heat transfer and a slight electric resistance at the contacting location. If soft solder such as tin solder or lead solder is used, high loads applied to the device and resulting in correspondingly intensive generation of heat may cause the melting temperature of the solder to be exceeded, at least locally, thus loosening the connection. If hard solder or brazing material such as silver or the like is used, the required joining temperature is so high that it may impair the properties of the semiconductor element previously bonded to the carrier plate, for example in a transistor, rectifier or photo-element. The use of pressure, soldering agents, and other auxiliaries in this case is permissible only to a limited extent because disturbances may be caused by mechanical tension or impurities.

A method is also known for mounting an electronic semiconductor element, joined with an electric supply lead in the form of a plate of good heat-conducting material, in a housing comprising a base plate of good heat-conducting material and a bell-shaped cover portion. According to this procedure the conductor plate joined with the semiconductor element is inserted at least partially into a recess of the considerably thicker base plate of the housing and is firmly joined in cold condition with the base plate by plastic deformation of the base-plate material. Thereafter the bell-shaped housing portion is connected with the base plate by further plastic deformation of the base-plate material. This method is described for example in the published German patent application DAS 1,098,103. In this known method the plate, serving as an electric supply lead for the semiconductor disc, consists of silver coated with gold. The base plate of the housing consists of soft copper which is readily deformable and has a good thermal conductance. This known method, however, is not applicable when the carrier plates employed are of a material whose thermal coefficient of expansion does not appreciably differ from that of the semiconductor material. This is because an alternating thermal stress, such as may occur in operation of the semiconductor device, may damage or destroy the bond between the base plate and the carrier plate, due to the fact that the respective thermal coefficients of expansion of these two parts differ from each other so greatly that a thermal displacement tends to loosen or eliminate the connection.

It is an object of my invention to eliminate these shortcomings heretofore encountered in semiconductor devices comprising a plate-shaped, substantially monocrystalline semiconductor body having at least one carrier plate, for example of molybdenum, joined or operatively or metallically connected or joined with the semiconductor body, the device having a good heat conducting terminal body in large-area engagement with the carrier plate.

According to the invention, the mutually facing surfacing portions of the carrier plate and the terminal body are lapped, intimately placed against each other in large-area contact, and permanently pressed against each other mechanically by pressure means that provide a permanent and stable, constant pressure-contact connection.

According to another, more specific feature of my invention the carrier plate is fastened on a projection of the terminal body by means of a clamp-like holder. It is preferable to have the dimensions of the carrier plate, the projection of the terminal body and the clamping holder so adapted to each other in the direction of the pressure force, and to employ materials of such thermal coefficients of expansion, that the thermal expansion of the holder in the direction of the pressure force is substantially equal to the sum of the thermal expansion of the carrier plate and the projection in this direction.

The foregoing and more specific objects and features of my invention, said features being set forth with particularly in the claims annexed hereto, will be apparent from rectifier devices selected by way of example embodying the present invention and described with reference to the accompanying drawings, wherein:

Figure 1:
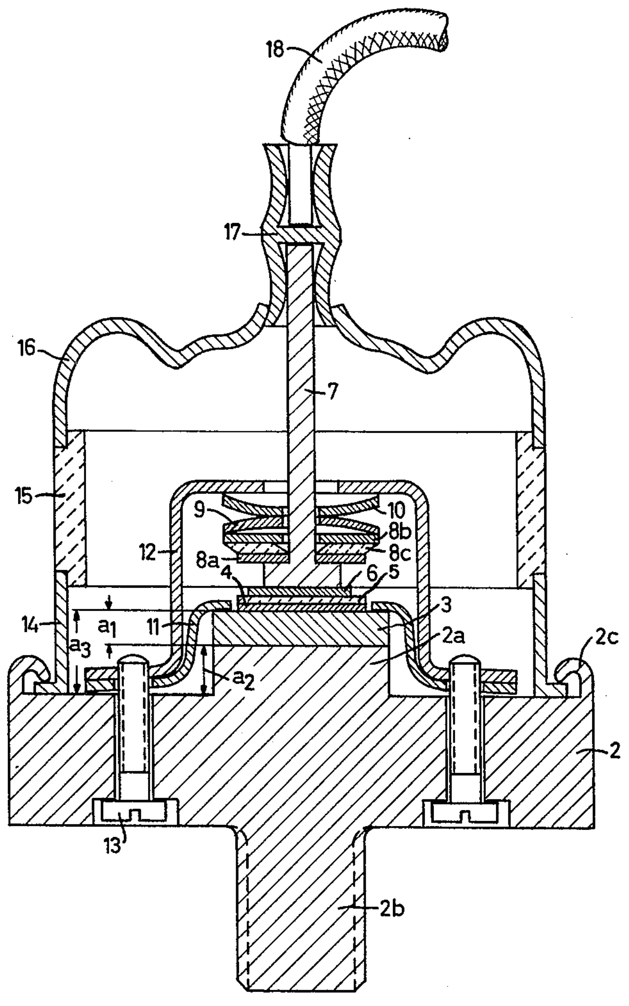
FIG. 1 is an axial section of a silicon power rectifier in which the above-mentioned holder structure is fastened by means of bolts to a massive terminal body serving as a heat sink.

The silicon power rectifier according to FIG. 1 is of the encapsulated type. The semiconductor element proper is fastened to a bottom portion 2 of the capsule. The bottom portion, also termed a contact terminal body, is rather thick and consists of a good heat-conducting material, for example copper. It possesses an integral threaded bolt 2*b* by means of which it can be fastened on a support also acting as a heat sink, for example upon mounting parts that are provided with cooling vanes or that contain a coolant circulation system. The bottom portion 2 has an upward central projection 2*a* upon which the rectifier element is fastened.

This rectifier element can be produced in the following manner. Placed upon a carrier plate formed of a molybdenum disc 3 of about 22 mm. diameter is an aluminum disc 4 of about 19 mm. diameter. Placed upon the aluminum disc is a plate or disc 5 of p-type silicon having a specific resistance of about 1000 ohm-cm. and a diameter of about 18 mm. Located on top of the silicon disc is a gold-antimony foil 6 of a somewhat smaller diameter, for example 14 mm., than the silicon disc 5. The element is produced by embedding the entire assembly into a powder that does not react with the above-mentioned materials and does not melt at the processing temperature. Suitable as embedding powder is graphite, for example. The assembly within the powder embedment is then heated under pressure at a temperature of about 800° C. The heating can be performed for example in an alloying furnace which is evacuated or filled with protective gas.

The product thus obtained can thereafter be etched in known manner. The etching is particularly applied to the portion of the semiconductor surface at which a p-n junction emerges. It is of advantage to thereafter provide the semiconductor surface with an oxide coating.

A semiconductor element produced in this manner is placed upon the projection 2*a*. The contact surface between the parts 2*a* and 3 is previously especially treated in order to secure a good heat transfer as well as a good electric contact. For example, the top side of the projection 2*a* is finely ground or lapped or ground to a polished surface, and thereafter provided with a relatively thick coating of silver or gold. This is done, for example, in an electrolytic bath to produce a silver coating of for example 10 to 20 microns or greater thickness. The advantage of a thicker foil coating of 50, or 100, or 200 microns is discussed below. Thereafter the surface is again lapped for a short interval of time. The molybdenum disc 3, too, is previously lapped to accurate planar shape on the bottom side with which it engages the top surface of the projection 2*a*.

Thereafter a plunger 7 is put upon the upper electrode of the semiconductor element consisting essentially of a gold-silicon eutectic. The plunger 7 may consist of copper, for example. Its bottom side, which subsequently touches the gold-silicon eutectic, is preferably provided with grooves that may be produced by turning on a lathe, or a pattern of grooves is pressed into the plunger surface, such as a number of small grooves spaced about 1 mm. from each other. Thereafter, this bottom surface of the plunger is likewise silver coated and slightly lapped. This results in a very clean contact area of the plunger 7 on the semiconductor element. It is preferable to also subject the gold-silicon eutectic to slight lapping prior to placing the plunger 7 thereupon. For this purpose, the semiconductor element can be placed for a short period of time into a lapping machine with the eutectic facing the lapping disc. The lapping duration may amount to about one-half to one minute.

A ring disc or washer 8 is then placed upon the plunger 7. The ring consists for example of individual discs or washers 8*a* and 8*b* made of steel which are firmly joined with each other by an insulating layer 8*c*. The insulating layer 8*c* may consist for example, of a heat-resistant varnish with a filler agent, and/or of a ceramic ring. Placed upon the ring disc 8 are two disc springs 9 and 10 likewise consisting of steel, for example.

Subsequently, two cup-shaped holder parts 11 and 12 are placed over the entire above-described assembly. The holders 11 and 12 may also consist of steel, for example. By means of screw bolts 13 uniformly distributed over the periphery of the bottom portion 2, the two holders 11 and 12 are forced against the bottom portion 2 and against each other and thereby press the individual parts of the assembly upon each other. The inner marginal portion of the clamp-like portion 11 touches the molybdenum disc 3 and presses it against the projection 2*a* of the bottom portion 2.

The two parts 2*a* and 3 are in contact with each other over a large area formed by lapped metallic surfaces. The holder part 11 provides a uniform contact pressure and simultaneously permits a thermal expansion of the mutually contacting parts without permitting them to become lifted or loosened from each other.

The dimensions of the molybdenum disc 3, the projection 2*a* and the holder 11 in the direction of the pressure force, and the thermal coefficient of expansion of these parts are so adapted that the thermal expansion of the holder 11 in the pressure direction, that is, in the direction of the symmetry axis of the entire device, is substantially equal to the thermal expansion of the parts 2*a* and 3 in this direction.

In the above-described example, the carrier plate 3 consists of molybdenum, the projection 2*a* of copper, and the holder 11 of steel. In this case the dimension of these parts in the direction of the pressure force must be related to each other approximately in the ratio 3:5:8. The molybdenum plate 3, for example, may have a thickness $a_1$ of 3 mm., the projection 2*a* a height $a_2$ of 5 mm., and the holder 11 a height $a_3$ of 8 mm.

The cup-shaped holder 11 is indirectly pressed against the bottom portion 2 by the marginal flange portion of the holder 12, whereas the holder portion 12, whose bores are in threaded engagement with the bolts 13, are directly pressed against the holder portion 2. Due to the disc springs 9, 10 and the ring 8, the holder part 12 exerts the necessary contact pressure upon the plunger 7.

The capsule in the illustrated embodiment is closed by a bell-shaped portion consisting of individual parts 14, 15, 16 and 17. It is preferable to assemble the bell-shaped portion from its individual parts before attaching the portion to the bottom portion 2.

In the illustrated embodiment a ring-shaped part 14 of the capsule, consisting for example of an iron-nickel-cobalt alloy such as available in the trade under the name Fernico, is connected with a ring-shaped part 15 of ceramic material by soldering, the part 15 being metallized at the soldering location. A bellows portion 16 of metal is likewise joined in the same manner with part 15 by soldering. Fastened to part 16 is a nipple portion 17 of metal having H-shaped cross section, for example by welding.

After placing the bell-shaped portion of the capsule upon the bottom portion 2, the capsule is closed and sealed by turning or spinning a flange portion 2*c* over a flange portion of the part 14. The nipple 17 is joined with the plunger 7 by pressing or crimping. An electric conductor 18, for example a braided copper litz wire, is inserted into the upper portion of the nipple 17 and is joined with the nipple likewise by pressing or crimping.

The encapsulated device as a whole possesses a very rugged mechanical design and withstands high alternating thermal stresses during operation.

Figure 2:
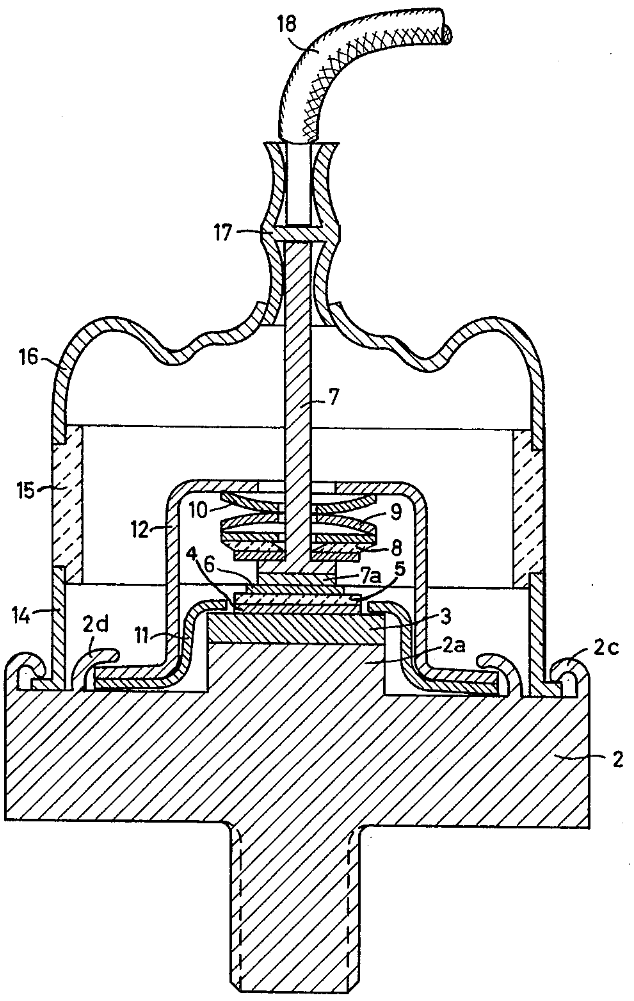
FIG. 2 shows another silicon power rectifier in axial section in which the holder structure is secured to the terminal and heat-sink body in a different manner.

The silicon power rectifier shown in FIG. 2 is designed substantially in a similar manner as the one described above with reference to FIG. 1, corresponding components being denoted by the same reference characters respectively. The difference resides in the fact that the holder parts 11 and 12 are fastened to the bottom portion 2 of the capsule not by means of screw bolts but are attached in the same manner as the bell-shaped housing portion by bending or spinning a flange-like projection 2*d* over the peripheral rim portions of the holders. Furthermore, an additional metal disc 7*a* is fastened to the plunger 7 and is located between the plunger 7 and the semiconductor element proper composed of the parts 3 to 6. The disc 7*a* may consist for example of molybdenum. The molybdenum disc may likewise be provided with a silver coating, for example a silver foil joined with the disc by hard-soldering and provided with an accurately defined reference surface by slight lapping. Prior to lapping, this silver coating may also be provided with a raised pattern of ridges.

Figure 3:
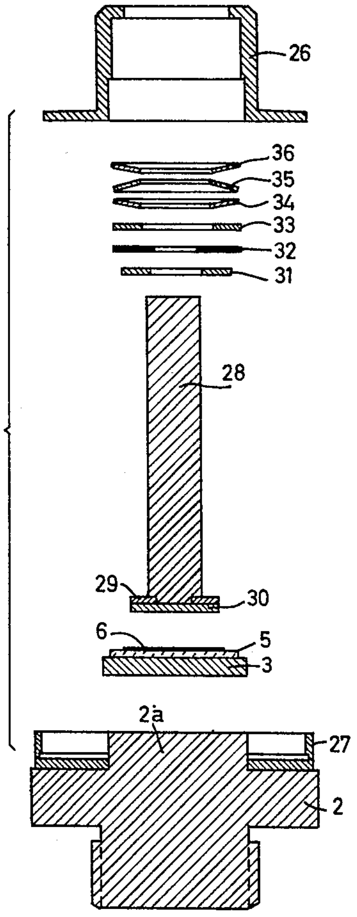
FIGS. 3 and 4 show in axial section a third embodiment, FIG. 3 being an exploded view of the components and FIG. 4 showing the assembled device.
Figure 4:
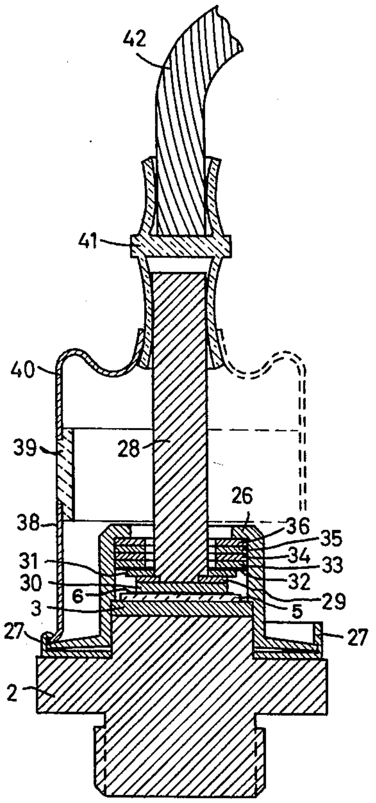
Figure 5:
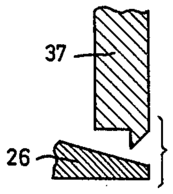
FIG. 5 shows in section a tool used for assembling the rectifier device according to FIGS. 3 and 4.

FIG. 3 shows components of the semiconductor device prior to being assembled with the device shown in FIG. 4. The tool shown in FIG. 5 is used for facilitating the assembling work. In this embodiment the holder part is extended beyond the plane of the flat side of the semiconductor facing the carrier plate, and the extension is designed as a holder means for further connecting parts on this side of the semiconductor element.

The semiconductor device of FIG. 4 comprises the terminal body 2 of copper, for example, and having a projection 2*a* upon which the carrier plate 3 is rigidly held by means of clamp-like holder 26. Before mounting carrier plate 3, for example of molybdenum, on the top surface of the projection 2*a*, said top surface is preferably coated with silver, electrolytically for example. The silver-plated surface of the projection as well as the bottom side of the carrier plate 3 are lapped to secure an accurate and intimate adaptation of the respective surfaces. Disposed on the top side of the carrier plate 3 is a semiconductor disc 5 (FIG. 3), for example of silicon, which is joined with the carrier plate for example by alloying. The element consisting of the parts 3 to 6 may have the same design as the one described in the foregoing with reference to FIG. 1.

Prior to placing the semiconductor element onto the projection 2*a* of the housing bottom portion 2, a further part 27 is joined with the bottom portion. The part 27 serves to fasten the holder 26 as well as further housing components. The part 27 can be joined with the bottom portion 2 by hard-soldering and may be made of steel.

The top side of the semiconductor element of FIG. 4, that is the electrode 6, consisting of a gold-silicon eutectic, is likewise made accurately planar by lapping, whereafter a plunger-like part can be placed into intimate contact engagement with the planar top side. The plunger part is preferably composed of a number of individual or separate components, before assemblying it with the other parts of the rectifier device. That is, the plunger is first assembled from a copper pin 28, a circular ring disc 29 likewise of copper, and a disc 30 of molybdenum. These parts are preferably all joined together by hard-soldering. The bottom side of the molybdenum disc 30, too, is preferably silver coated, for example by electrolytic plating, and is thereafter lapped to accurate planar shape.

The following parts are forced upon the plunger assembly in the sequence stated. A ring disc or washer 31 consisting for example of steel, a mica disc or washer 32, a further steel disc or washer 33, and three disc springs 34, 35 and 36 are forced upon the plunger. Thereafter the cup-shaped holder 26 is forced down over the plunger assembly, the disc springs are pressed together, and the holder cup 26 is pressed with its flange portion into an undercut groove of the fastening part 27, this being done with the aid of the tool or auxiliary device 37 shown in FIG. 5.

As is apparent from FIG. 4, the device thus designed and produced is distinguished by a very compact construction in which all components are securely held and fastened in accurate position relative to one another, and cannot become displaced by mechanical vibration or impact, nor by thermal expansion. An important function in this respect is performed by the mica disc 32 which serves for electric insulation as well as for centering the plunger assembly within the holder cup 26 and thus also relative to the semiconductor element proper. The outer edge of the mica disc 32 is in contact with the holder cup 26, whereas the inner edge touches the copper pin 28 of the plunger assembly.

The encapsulation is completed by placing a bell-shaped housing portion, composed of parts 38, 39, 40 and 41, over the entire assembly of components described above. The lower end of the bell-shaped housing portion is secured to the bottom portion 2 by spinning and bending the part 27 over the flange-like edge of the bell. The copper pin 28 is joined with the nipple 41 of the bell by pressing or crimping. The nipple 41 may consist of copper, whereas the parts 38 and 40 may consist of steel or an iron-nickel-cobalt alloy as known under the name Fernico, or available in the trade under the names Kovar and Vacon. The part 39 preferably consists of ceramic and serves insulating purposes. It is metallized at those places where it engages the parts 38 and 40 and is joined therewith by soldering. A cable 42 is inserted into the nipple 41 and is likewise joined therewith by pressing or crimping.

Figure 6:
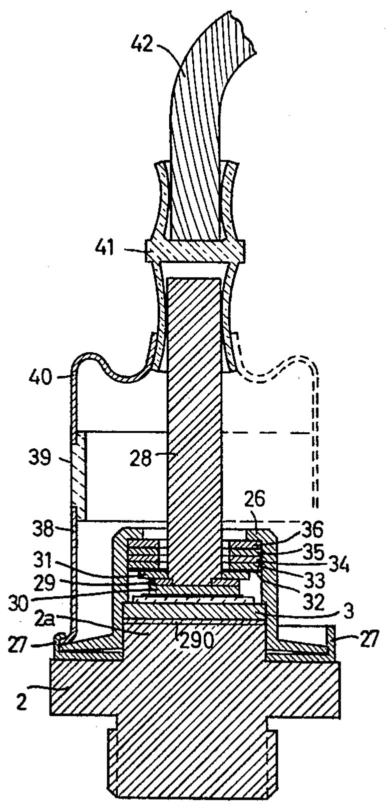
FIG. 6 shows in axial section still another rectifier according to the invention.

The rectifier device shown in FIG. 6 is substantially similar to that of FIG. 4, corresponding components being designated by the same reference characters respectively. Added in the device of FIG. 6 is a silver layer 290 between the projection 2*a* of the housing bottom portion 2 and the molybdenum carrier plate 3.

According to the embodiments of the invention so far described, the carrier plate 3 is placed upon the projection 2*a* of the terminal body after the projection is electro-plated with silver. It has been found that such silver-plating is not sufficient in some cases, and that it is preferable to deposit a thick silver coating, for example a foil of 100 to 200 microns thickness. With a thickness of the silver coating of more than 50 microns, or .05 mm., penetration of the copper through this silver coating is reliably prevented. A silver coating of such thickness is difficult to produce electrolytically. The penetration of copper must be prevented because the carrier plate would not be capable of gliding laterally, sufficiently, if it is in contact with copper.

As has been ascertained by test and in practice, it is not necessary to fasten the silver layer 290 on the copper block by soldering or the like bonding means. It suffices if the copper layer is merely placed between the projection 2*a* of the terminal body 2 and the carrier plate 3. The passage of current and heat are impeded by this intermediate silver layer only to such a slight extent that the impediment remains negligible.

This silver layer 290 may consist for example of a silver foil which is provided on both sides with a raised pattern, for example an embossed waffle pattern similar to the knurling of knurled knobs.

According to a preferred feature of the invention, this silver foil is annealed and subsequently etched, for example by means of nitric acid, whereby a fine etching pattern results on the surface. It is preferable to subject the top side of the projection 2*a* and the bottom side of the molybdenum disc 3 to lapping to obtain an accurate planar shape for securing a good heat and current passage between these parts and the silver foil.

The silver layer 290 may also be designed as a mesh of fine silver wires, for example silver wire of 0.05 to 0.3 mm. wire thickness. It is preferable to first slightly graphitize the side of the carrier plate to be placed upon the silver layer. For this purpose, this surface of the carrier plate may be rubbed with graphite powder.

To those skilled in the art it will be obvious, upon study of this disclosure, that with respect to structural details and materials as well as the particular kind of electronic semiconductor device employed, my invention permits of a variety of modifications and hence can be given embodiments other than particularly illustrated and described herein, without departing from the essential features of my invention and within the scope of the claims annexed hereto.

I claim:

1. An electronic semiconductor device, comprising a substantially monocrystalline semiconductor plate having a coefficient of expansion, a carrier plate structure comprising a metal having a coefficient of expansion substantially equal to that of said semiconductor plate, said carrier plate structure being operatively connected over a large area to said semiconductor plate, a contact terminal body of good conducting metal, said carrier plate structure and said terminal body having respective lapped surfaces extending in a flat plane and bearing force against each other, an intermediate layer between said respective surfaces, said intermediate layer comprising a metal of the group consisting of silver and gold, and clamping means urging said carrier plate structure and said terminal body together and forming when the device is assembled and securely held together a permanent pressure contact between said intermediate layer and said respective surfaces.

2. An electronic semiconductor device, comprising a substantially monocrystalline semiconductor plate having a coefficient of expansion, a carrier plate structure comprising a metal having a coefficient of expansion substantially equal to that of said semiconductor plate, said carrier plate structure being operatively connected over a large area to said semiconductor plate, a contact terminal body of good conducting metal having a raised portion, said carrier plate structure and said terminal body having respective lapped surfaces extending in a flat plane and bearing force against each other, an intermediate layer between said respective surfaces, said intermediate layer comprising a metal foil of the group consisting of silver and gold, and clamping means urging said carrier plate structure and said terminal body together and pressing said carrier plate structure against the raised portion of said terminal body and forming when the device is assembled and securely held together a permanent pressure contact between said intermediate foil and said respective surfaces.

3. An electronic semiconductor device, comprising a substantially monocrystalline semiconductor plate, a metal carrier plate structure operatively connected over a large area to said semiconductor plate, said carrier plate structure having a first determined thickness, a contact terminal body of good conducting metal having a raised portion extending a second determined distance above the remainder thereof, said carrier plate structure and said terminal body having respective surfaces extending in a flat plane and bearing force against each other, and clamping means urging said carrier plate structure and said terminal body together and pressing said carrier plate structure against the raised portion of said terminal body and forming when the device is assembled and securely held together a permanent pressure contact between said respective surfaces, said clamping means comprising a substantially bell-shaped member extending a third determined distance above said terminal body, said first, second and third determined distances having a determined ratio relative to each other for substantially equalizing the thermal expansion of said clamping means in the direction of the pressure force to the sum of the thermal expansions of said carrier plate and the raised portion of said contact terminal body in said direction.

4. An electronic semiconductor device according to claim 3, wherein the raised portion of said contact terminal body is of copper, the lapped carrier plate structure surface is of molybdenum, said spring means is of steel and said determined ratio is 3:5:8.

5. An electronic semiconductor device according to claim 1, wherein the contact surface of said contact terminal body is adherently coated separated by a layer of a metal of the group consisting of silver and gold, said layer being intermediate said respective surfaces.

6. An electronic semiconductor device as claimed in claim 2, wherein said clamping means is affixed to said contact terminal body and contacts said carrier plate structure.

7. An electronic semiconductor device as claimed in claim 3, wherein said respective surfaces are lapped.

8. An electronic semiconductor device, comprising a substantially monocrystalline semiconductor plate, a metal carrier plate structure operatively connected over a large area to said semiconductor plate, a contact terminal body of good conducting metal, said carrier plate structure and said terminal body having respective surfaces extending in a flat plane and bearing force against each other, and pressure exerting means clamping said carrier plate structure and said terminal body together and forming when the device is assembled and securely held together a permanent pressure contact between said two surfaces, an outer housing structure having a recessed portion, an electrode, means to press said electrode against said terminal body, said means comprising a rigid metal member having a first end portion bearing force against said electrode, the opposite end portion being supported against said housing structure, an inner holding structure, the rigid member extending centrally through said inner holding structure, annular spring means surrounding the rigid member and bearing force between the first end portion of the rigid member and the holding structure, to force the rigid member in the direction toward said terminal body, annular electrical insulation means fitting around the rigid member for insulating the spring means from the rigid member, said insulation means forming a centering disc, the outer edge of which contacts the inside walls of the holding structure, means firmly affixing said outer housing structure and said inner holding structure to said terminal body.

9. An electronic semiconductor device, comprising a substantially monocrystalline semiconductor plate, a carrier plate of molybdenum operatively connected over a large area to said semiconductor plate, a contact teminal body of good conducting metal, said carrier plate and said terminal body having respective lapped surfaces extending in a flat plane and bearing force against each other, a silver layer having a thickness greater than .05 mm. on the surface of said terminal body, and clamping means clamping said carrier plate and said terminal body together and forming when the device is assembled and securely held together a permanent pressure contact between said silver layer and the surface of the carrier plate, said pressure contact permitting sliding of the surface of said carrier plate on said silver layer thereby compensating for different thermal expansions of said carrier plate and said terminal body to be compensated.

10. An electronic semiconductor device as claimed in claim 1, wherein said intermediate layer is a silver foil.

11. An electronic semiconductor device as claimed in claim 10, wherein said silver foil has a raised pattern on both sides.

12. An electronic semiconductor device as claimed in claim 1, wherein said intermediate layer is a wire mesh.

13. An electronic semiconductor device as claimed in claim 9, wherein said surface of said carrier plate which forms part of the pressure-contact connection is graphitized.

14. Electronic semiconductor apparatus, comprising a semiconductor device comprising a monocrystalline silicon semiconductor plate; a metallic carrier structure having a surface in large-area face-to-face contact therewith, the metallic structure having its other large area face lapped to accurate flat planar shape; a gold foil electrode in large-area face-to-face contact with the semiconductor plate, the gold foil and the metallic structure being on opposite faces of said semiconductor plate; a contact terminal of good heat-conducting metal, the terminal having a middle raised portion having a finely ground flat surface; a silver layer on said flat surface, the said outer surface of the metallic carrier structure being in contact with said silver layer, said gold and silicon being heat-bonded together to form a gold-silicon alloy; an outer housing structure having upper and lower metal sections electrically insulated from each other; means to press said electrode against said middle raised portion, said means comprising a rigid metal member having a first end portion bearing force against said gold electrode, the opposite end portion being held against said outer housing structure; an inner holding structure, said rigid member extending through said inner holding structure; spring means bearing force between the first end portion of the rigid member and the inside of the holding structure to force the rigid member in the direction toward said middle raised portion; electrical insulation means for insulating the spring means from the rigid means; and means firmly affixing said outer housing structure and said inner holding structure to said metal contact terminal.

15. Electronic semiconductor apparatus, comprising a semiconductor device comprising a monocrystalline silicon semiconductor plate; an aluminum plate in large-area face-to-face contact therewith; a molybdenum plate having a surface in large-area face-to-face contact with the aluminum plate, the molybdenum plate having its other large-area face lapped to accurate flat planar shape; a gold foil electrode in large-area face-to-face contact with the semiconductor plate, the gold foil electrode and the aluminum plate being on opposite faces of the semiconductor plate; a massive block of metal having good heat conduction, said block having a middle raised portion having a finely ground flat surface; a silver layer on said flat surface, said other surface of said molybdenum plate being in contact with said silver layer, said gold and silicon being heat-bonded together to form a gold-silicon alloy; an outer housing structure having a recessed portion, upper and lower metal sections and a ceramic section intermediate to and bonded to the metal sections and electrically insulating the metal sections from each other; means to urge said electrode toward said metal block; said means to urge said electrode comprising a rigid metal member having a first end portion bearing force against said electrode, the opposite end portion being supported against lateral forces by retention in said recessed portion of the outer housing structure; an inner clamping structure, said rigid member extending through said inner clamping structure; spring means bearing force between the first end portion of the rigid member and the inside of the clamping structure to force the rigid member in the direction toward said metal block; electrical insulation means for insulating the spring means from the rigid metal member; and means for affixing said outer housing structure and said inner holding structure to said metal block.

16. An electronic semiconductor power rectifier apparatus, comprising a semiconductor device comprising a monocrystalline silicon semiconductor plate; an aluminum plate in face-to-face contact therewith; a molybdenum plate having a surface in face-to-face contact with the aluminum plate, the molybdenum plate having its other surface lapped to accurate flat planar shape; a gold foil electrode in face-to-face contact with the semiconductor plate, the gold foil and the aluminum plate being on opposite faces of the semiconductor plate; a massive block of copper having good electric and heat conduction, said block having a middle raised portion having a finely ground flat surface; a silver coating from 10 to 200 microns thick on said flat surface, said coating having an outer surface finely lapped to accurate planar shape, said other surface of the molybdenum plate being in face-to-face contact with the outer surface of said silver coating, said gold and silicon being heat-bonded together to form a gold-silicon alloy electrode; an outer bell housing structure having a recessed portion, upper and lower metal sections and a ceramic section intermediate to and bonded to the metal sections and electrically insulating the metal sections from each other; means to urge said electrode toward said copper block, said means to urge said electrode comprising a rigid metal member having a first end portion bearing force against said electrode, the opposite end portion being supported against lateral forces by retention in said recessed portion of the outer housing structure; an inner holding structure having top and side walls, said rigid member extending centrally through said inner holding structure; annular spring means disposed around said rigid member and bearing force between the first end portion of said rigid member and the inside of the holding structure when the apparatus is assembled and secured together to hold the rigid member against said metal block; electrical insulation means for insulating the spring means from said rigid member comprising a centering disc fitting around the rigid member, the outer edge of said centering disc contacting the inside walls of the holding structure; and means affixing said bell housing structure and said inner holding structure to said metal block.

References Cited by the Examiner

UNITED STATES PATENTS

| | | | |
|---|---|---|---|
| 2,826,725 | 3/1958 | Roberts | 317—235 |
| 2,838,722 | 6/1958 | Watson | 317—234 |
| 2,861,226 | 11/1958 | Lootens | 317—235 |
| 2,863,105 | 12/1958 | Ross | 317—234 |
| 2,896,136 | 7/1959 | Hales | 317—234 |
| 2,941,149 | 6/1960 | Rhodes | 317—241 X |
| 2,957,112 | 10/1960 | Sils | 317—235 |
| 2,972,096 | 2/1961 | Johnson | 317—234 |
| 3,050,667 | 8/1962 | Emeis | 317—235 |
| 3,051,878 | 8/1962 | Finn et al. | 317—235 |

JOHN W. HUCKERT, *Primary Examiner.*

DAVID GALVIN, J. A. ATKINS, J. D. KALLAM, *Assistant Examiners.*